US005956595A

United States Patent [19]
Zenke

[11] Patent Number: 5,956,595
[45] Date of Patent: Sep. 21, 1999

[54] METHOD OF FABRICATING A SEMICONDUCTOR INTEGRATED CIRCUIT HAVING A CAPACITOR WITH LOWER ELECTRODE COMPRISING TITANIUM NITRIDE

[75] Inventor: Masanobu Zenke, Tokyo, Japan

[73] Assignee: NEC Corporation, Tokyo, Japan

[21] Appl. No.: 08/892,999

[22] Filed: Jul. 15, 1997

[30] Foreign Application Priority Data

Jul. 15, 1996 [JP] Japan ................................. 8-184830

[51] Int. Cl.⁶ ............................................. H01L 21/8242
[52] U.S. Cl. ........................ 438/398; 257/310; 438/399
[58] Field of Search .................................. 438/396, 397, 438/398

[56] References Cited

U.S. PATENT DOCUMENTS

| 5,110,752 | 5/1992 | Lu ............................................. 438/398 |
| 5,688,724 | 11/1997 | Yoon et al. ............................. 438/393 |

FOREIGN PATENT DOCUMENTS

| 1-94645 | 4/1989 | Japan . |
| 4-101453 | 4/1992 | Japan . |
| 5-304273 | 11/1993 | Japan . |
| 6-151751 | 5/1994 | Japan . |
| 6232344 | 8/1994 | Japan . |
| 7-202019 | 8/1995 | Japan . |
| 7211796 | 8/1995 | Japan . |
| 7-335842 | 12/1995 | Japan . |

OTHER PUBLICATIONS

Anomalous Ti Salicide Gate to Source/Drain Shorts Induced By Dry Etch During TiSi2 Local Interconnet Formation, W. Ting, pp. 283–285, IEEE, Electron Device Letters, vol., 15, Aug. 1994.
K. Shibahara et al., "1GDRAM Cell with Diagonal Bit–Line (DBL) Configuration and Edge Operation MOS(EOS) FET", IEDM 94, Dec. 14, 1994, pp. 639–642.

*Primary Examiner*—Olik Chaudhuri
*Assistant Examiner*—William David Coleman
*Attorney, Agent, or Firm*—Sughrue, Mion, Zinn, Macpeak & Seas, PLLC

[57] ABSTRACT

In order to fabricate a semiconductor device having a stacked capacitor cell, a silicon substrate is first prepared. A lower capacitor electrode having a porous surface is then formed on the silicon substrate. Following this, the lower capacitor electrode is selectively covered with a titanium nitride film. Further, a dielectric film of a material, exhibiting high permittivity or feroelectricity, is deposited on said titanium nitride film, and an upper capacitor electrode is deposited on the dielectric film.

8 Claims, 8 Drawing Sheets

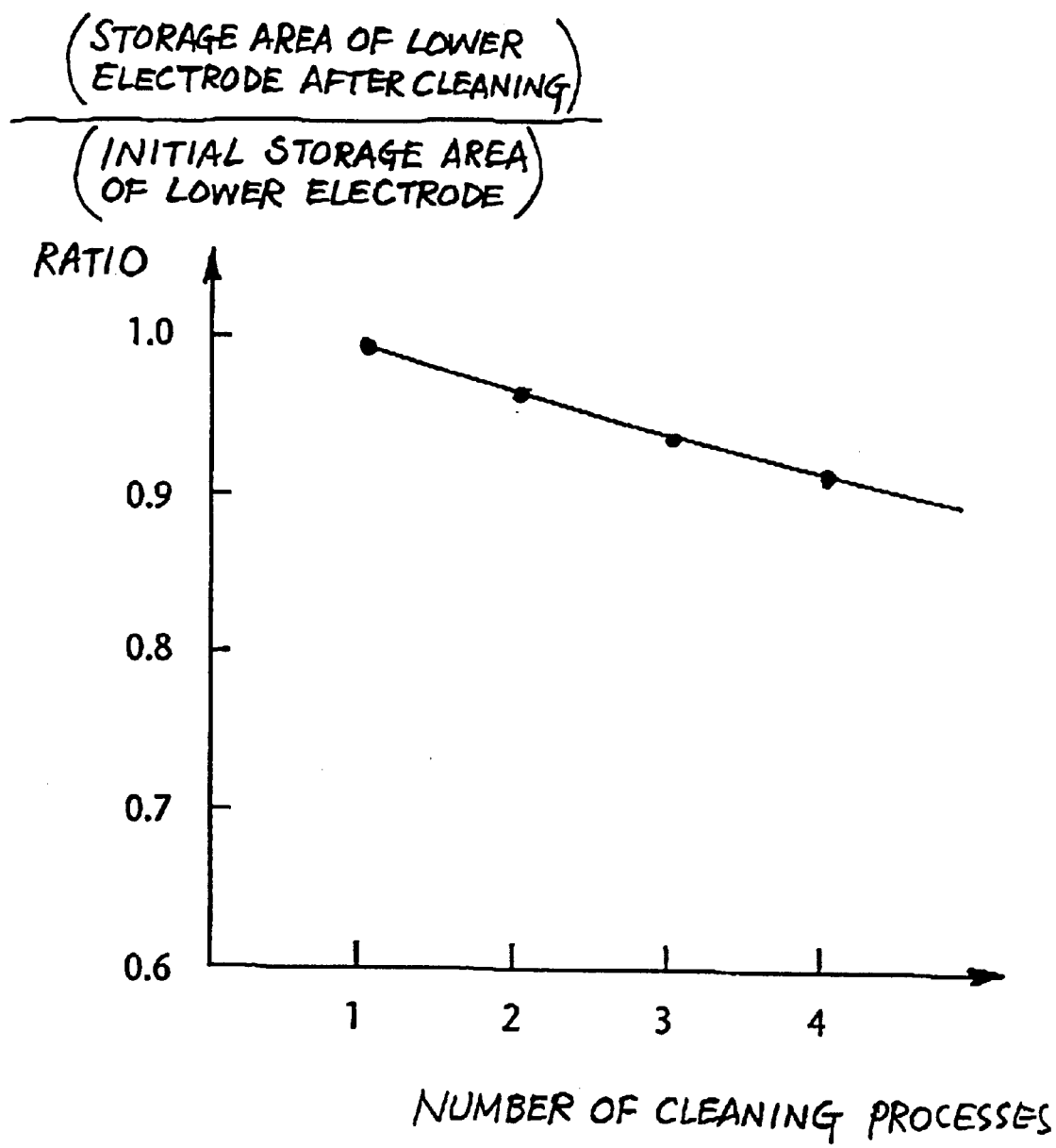

METHOD OF FABRICATING A SEMICONDUCTOR INTEGRATED CIRCUIT HAVING A CAPACITOR WITH LOWER ELECTRODE COMPRISING TITANIUM NITRIDE

BACKGROUND OF THE INVENTION

1. Field of the Invention

The present invention relates generally to a method of fabricating a semiconductor integrated circuit (IC) having a stacked capacitor cell, and more specifically to a method of fabricating an IC circuit having a capacitor whose surface is rendered porous for increasing an effective charge storage area.

2. Description of the Related Art

As is known in the art, a storage capacitor is provided in each dynamic random access memory (DRAM) cell. In order to meet an ever-increasing demand for higher packaging density, it is a current practice to configure each storage capacitor in a three-dimensional structure. Generally, there are two types of three-dimensional capacitor cells, one of which is a stacked capacitor cell and the other is a trenched capacitor cell.

With increase in miniaturization of semiconductor devices such as 64 M-bit or higher bit density DRAM, a capacitor storage area becomes strictly limited. Accordingly, in order to adequately meet such a tendency, it has been proposed to use, as a capacitor dielectric film, tantalum oxide ($Ta_2O_5$) of high permittivity in place of silicon oxide or silicon nitride. In this case, in order to prevent undesirable reaction between the $Ta_2O_5$ film and polysilicon film (forming a lower capacitor electrode) and also to prevent forming of a silicon oxide film therebetween, it has been proposed to provide titanium nitride between the $Ta_2O_5$ film and the polysilicon film.

Before turning to the present invention, a brief description of a first conventional technique of fabricating a stacked capacitor cell is given with reference to FIGS. 1A–1G. This first conventional technique is disclosed in Japanese Laid-open Patent Application No. 4-101453.

The sequence of fabricating the stacked capacitor cell, shown in FIGS. 1A–1G, starts with preparation of a silicon substrate 10. A silicon oxide film 12 is then deposited on the top surface of the substrate 10 for electrically isolating a capacitor from other circuit components. A contact hole 14 is formed in the silicon oxide film 12 using known lithographic and dry etching techniques. A polysilicon film 16 is then deposited in a manner to electrically contact a part of the top surface of the silicon substrate 10 through the hole 14 as illustrated in FIG. 1A. Thereafter, an impurity such as phosphorous is doped into the polysilicon film 16 which serves as a lower electrode of the capacitor.

The structure shown in FIG. 1A is then subjected to preprocessing and/or cleaning for removing native oxides on the polysilicon film 16. Thereafter, a titanium film 18 is deposited, using sputtering (for example), on the entire top surface of the structure as shown in FIG. 1B. In the above, in the pre-processing, dilute hydrofluoric acid, or a mixed solution of hydrofluoric acid and ammonium fluoride, is used. On the other hand, in the cleaning, a so-called RCA cleaning (viz., cleaning techniques proposed by Radio Corporation of America) is used wherein a mixed solution of hydrogen peroxide and ammonia or a mixed solution of hydrogen peroxide and sulfuric acid is used.

Subsequently, the structure shown in FIG. 1A is annealed at temperatures between 500° C. and 700° C. and in an atmosphere of nitrogen or ammonia, or in an atmosphere of mixed gases of nitrogen and ammonia. Thus, as shown in FIG. 1C, the titanium film 18 on the lower electrode 16 changes to a titanium silicide ($TiSi_2$) film 20, while the titanium film 18 on the silicon oxide film 12 changes to a titanium nitride film 22. The resultant structure thus obtained is immersed in a water solution containing ammonia and hydrogen peroxide, whereby the titanium nitride film 22 is selectively removed as shown in FIG. 1D.

The structure shown in FIG. 1D is then subjected to annealing at temperatures between 800° C. and 1000° C. in a gas atmosphere of nitrogen or ammonia or in a mixed gas atmosphere of nitrogen and ammonia. Thus, the titanium silicide film 20 changes to a titanium nitride film 24. Following this, as shown in FIG. 1F, a $Ta_2O_5$ film 28 of about 5 to 50 nm thick is deposited onto the top surface of the structure of FIG. 1E using a spattering or chemical vapor deposition (CVD) technique. The $Ta_2O_5$ film 28 serves as a capacitor dielectric film. As shown in FIG. 1G, an upper capacitor electrode 28 is then formed on the $Ta_2O_5$ film 26 in the same manner as the lower electrode was formed, whereby the capacitor is formed on the substrate 10.

As mentioned above, the $Ta_2O_5$ film 26 is used as a capacitor dielectric film. It is therefore necessary to provide the titanium nitride film 24 between the polysilicon film (viz., lower capacitor electrode) 16 and the $Ta_2O_5$ film 26 in order to prevent undesirable reaction between the films 16 and 26 or to prevent a silicon oxide from being grown in the boundary therebetween. As a result, the conventional method has suffered from the problem that the processing step of forming the titanium nitride film 24 is required.

In addition to the first conventional method, in order to meet recent requirements of increasing an effective capacitance area of the lower electrode in a giga-bit memory cell, a technique of depositing a plurality of hemisphere grids (HSGs) on the lower electrode has been proposed. By way of example, such a technique is disclosed in a paper entitled "1 GDRAM cell with diagonal bit-line (DBL) configuration and edge operation MOS (EOS) FET" by K. Shibahara, et al., International Electron Devices Meeting 1994, pages 639–642. According to this second conventional technique, after a plurality of HSGs are grown on the surface of a lower capacitance electrode, a $Ta_2O_5$ dielectric film is deposited on the lower electrode. However, in order to eliminate the same problems as mentioned in connection with the first prior art, a titanium nitride layer is provided between the polysilicon film (viz., lower electrode) and the $Ta_2O_5$ dielectric film.

Prior to forming the titanium nitride film, the lower electrode should be subjected to pretreatment and cleaning processes in order to remove native (nature) oxide(s). These processes tend to etch top portion of each HSG with the result of reducing the effective storage area of the lower electrode. In other words, the porous surface of the electrode is gradually rendered smoothed with each cleaning process. Further, the degree of lowering the storage area depends on the number of pretreatment and cleaning processes, which leads to scattering of resulting capacitance values with different lots.

SUMMARY OF THE INVENTION

It is therefore an object of the present to provide a method of fabricating a semiconductor integrated circuit having a stacked capacitor, wherein the number of fabrication steps can be reduced compared to the conventional techniques.

Another object of the present invention is to provide a method of fabricating a semiconductor integrated circuit having a stacked capacitor, wherein the effective storage area is not reduced during the fabrication processes.

One aspect of the present invention resides in a method of fabricating a semiconductor device, comprising the steps of (a) preparing a substrate for an integrated circuit having a capacitor; (b) forming a lower capacitor electrode on the substrate, the lower capacitor electrode having a porous surface; (c) depositing a titanium nitride film on the lower capacitor electrode; (d) depositing a dielectric film of a material, exhibiting high permittivity or feroelectricity, on the titanium nitride film; and (e) depositing an upper capacitor electrode on the dielectric film.

BRIEF DESCRIPTION OF THE DRAWINGS

The features and advantages of the present invention will become more clearly appreciated from the following description taken in conjunction with the accompanying drawings in which like elements are denoted by like reference numerals and in which:

FIG. 4 is a graph showing a manner wherein a storage area decreases as the number of wafer cleaning increase.

DETAILED DESCRIPTION OF THE PREFERRED EMBODIMENTS

A first embodiment of the present invention will be described with reference to FIGS. 2A–2F.

Figure 1A:
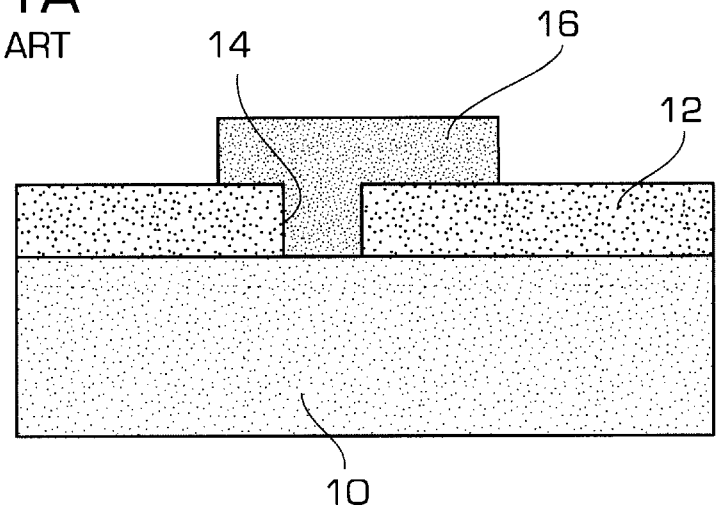
FIGS. 1A–1G are each being a cross-sectional view showing a fabrication step for forming a stack capacitor cell according to the conventional technique, having been referred to in the opening paragraphs.
Figure 1B:
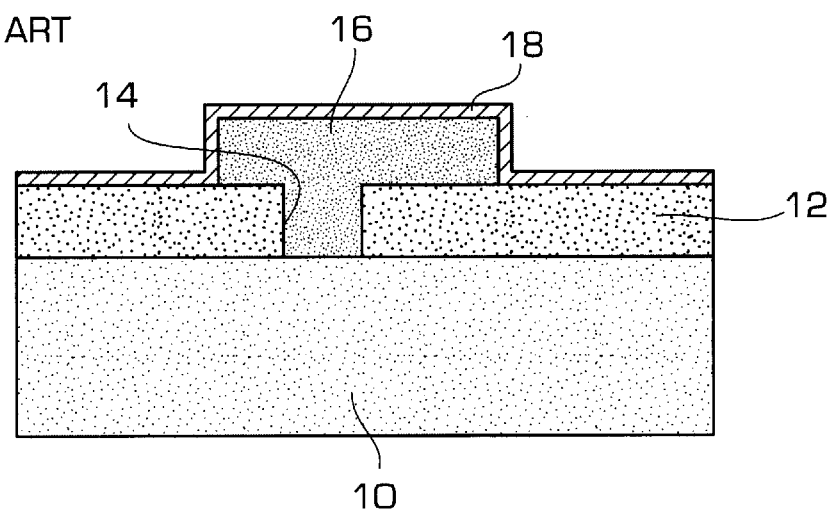
Figure 1C:
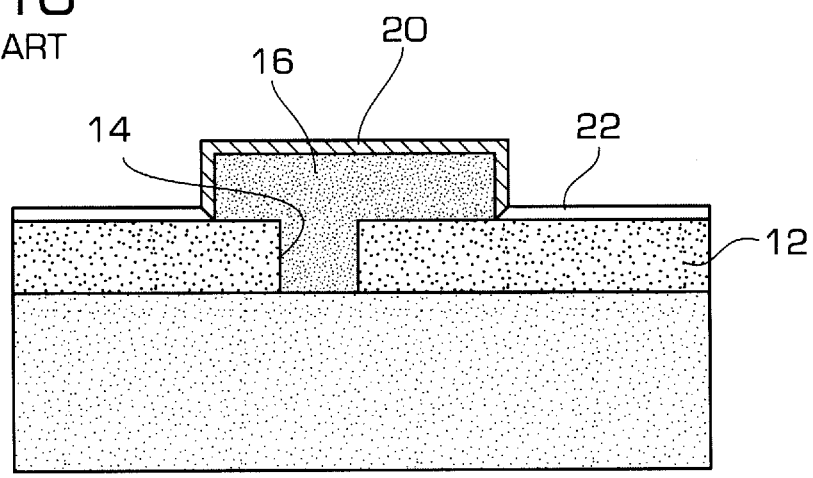
Figure 1D:
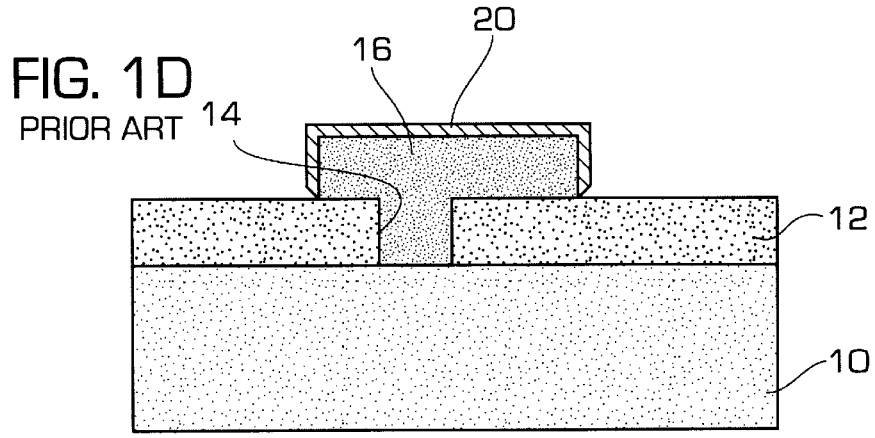
Figure 1E:
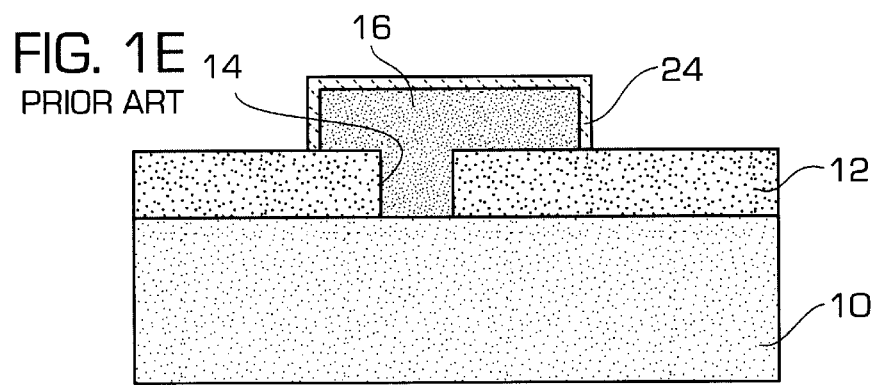
Figure 1F:
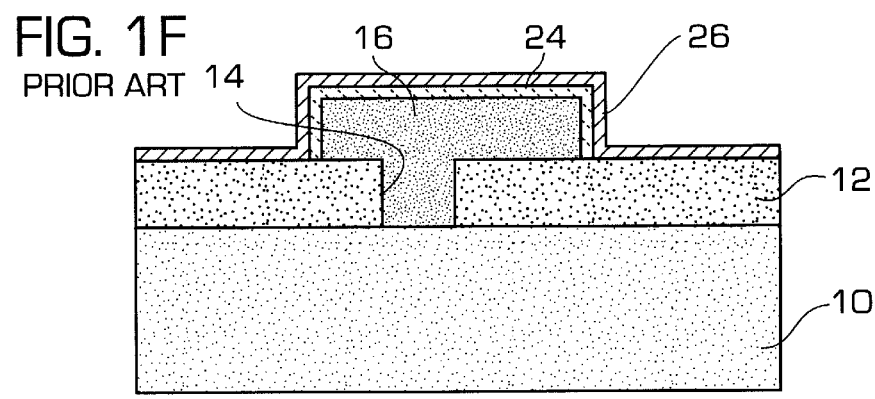
Figure 1G:
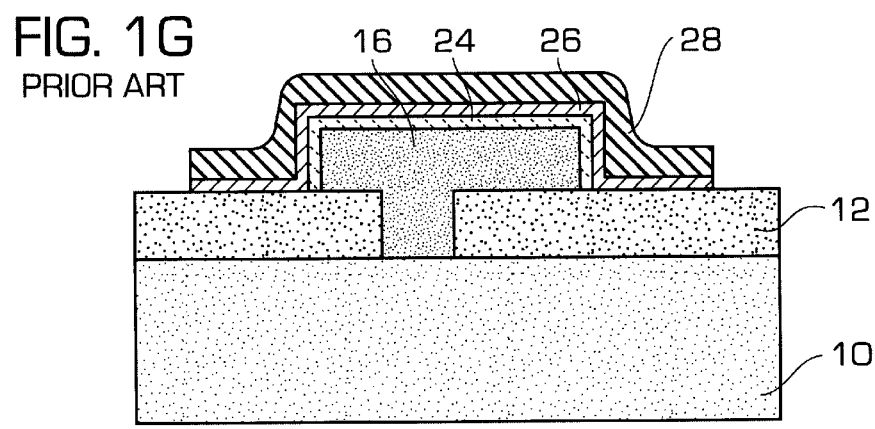
Figure 2A:
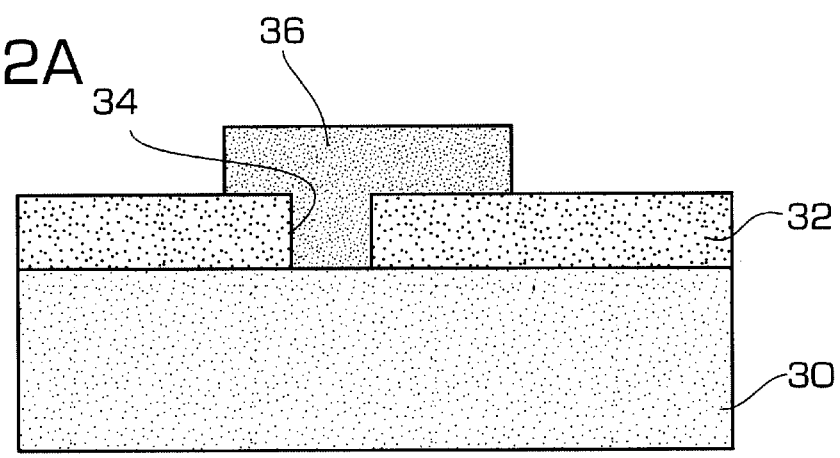
FIG. 2A–2F are each being a cross-sectional view showing a fabrication step for forming a stacked capacitor cell according to a first embodiment of the present invention.

As in the first conventional technique, the sequence of fabricating the stacked capacitor cell starts with preparation of a silicon substrate 30. As shown in FIG. 2A, a silicon oxide film 32 is deposited on the top surface of the substrate 30 for electrically isolating the capacitor cell from other circuit components. A contact hole 34 is formed in the silicon oxide film 32 using known lithographic and dry etching techniques. A phosphorous-doped amorphous silicon film 36 of about 200 to 500 nm thick is grown on the entire top surface of the silicon oxide 32 using a CVD process under the conditions: reactive gases of $Si_2H_6$ (or $SiH_4$) and $PH_3$, pressure of 13 to 26 Pa, temperatures between 500° C. and 600° C., and phosphorus concentration of $1\times10^{20}$ to $5\times10^{20}$ atoms/cm$^3$ in the film 36. As shown in FIG. 2A, the amorphous silicon film 36 is then patterned so as to shape a lower capacitor electrode using known lithography and dry etching techniques.

Figure 2B:
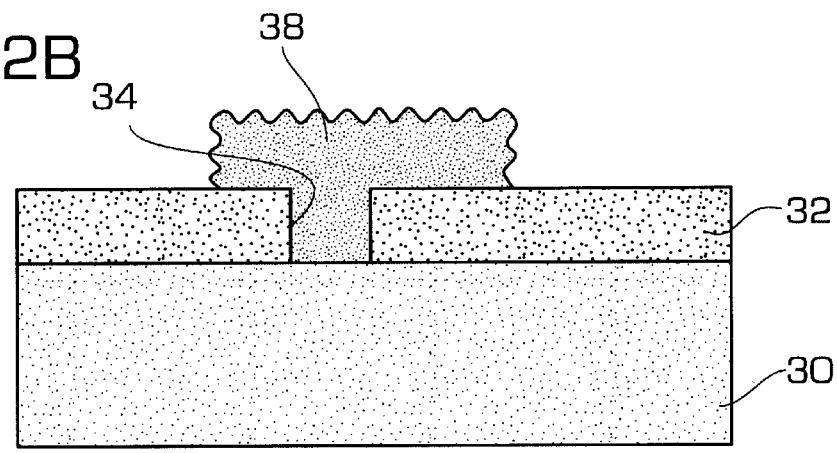

As shown in FIG. 2B, the exposed surface of the amorphous silicon film 36 is then rendered porous (viz., uneven) by growing a plurality of HGSs thereon. How to grow or incubate HGSs on an amorphous silicon film is disclosed in Japanese Laid-open Patent Application No. 5-304273 (for example) and thus, a brief description thereof is given. The HGSs grow by flowing an $Si_2H_6$ gas at a flow rate of 20–30 cc/m for one to two minutes at temperatures between 540° C. and 650° C., under pressure less than 0.133 Pa, and being followed by beating for one to ten minutes. The provision of the HGSs on the film 36 is able to increase about twice the surface area thereof. For the sake of convenience of description, the amorphous silicon film 36 on which the HGSs are grown is denoted by numeral 38.

Figure 2C:
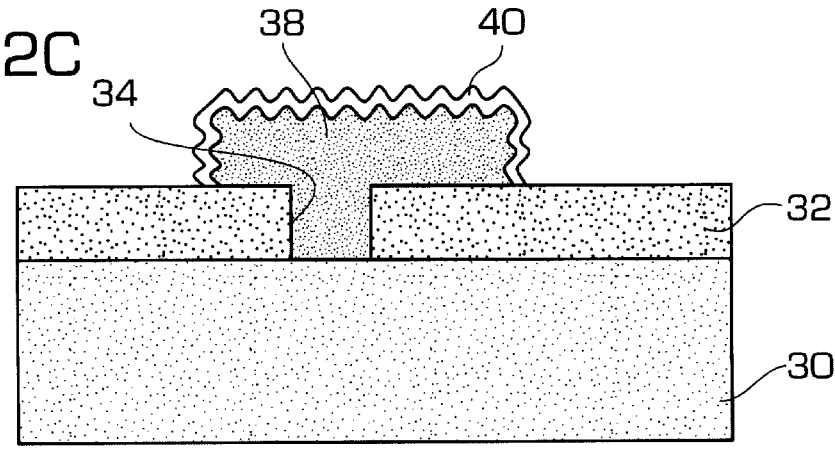

Subsequently, as shown in FIG. 2C, a titanium silicide film 40 of about 1 to 20 nm thick is selectively deposited on the film 38 using a plasma-assisted CDV process. That is, the titanium silicide film 40 is formed using titanium tetrachioride ($TiCl_4$) at a flow rate of 0.1–1.0 cc/m, silane ($SiH_4$) at a flow rate of 1–10 cc/m, hydrogen ($H_2$) at a flow rate of 10–50 cc/m, argon (Ar) at a flow rate of 10–50 cc/m, pressure of 0.3 to 1.0 Pa, a radio frequency (RF) power of 50 to 200 W, and temperatures between 600° C. and 750°C.

The substrate 30 is then subjected to annealing in an atmosphere of nitrogen or ammonia at temperatures between 700° C. and 900° C. Thus, the titanium silicide film 40 is nitrogenized and changes to a titanium nitride film 42.

Figure 2D:
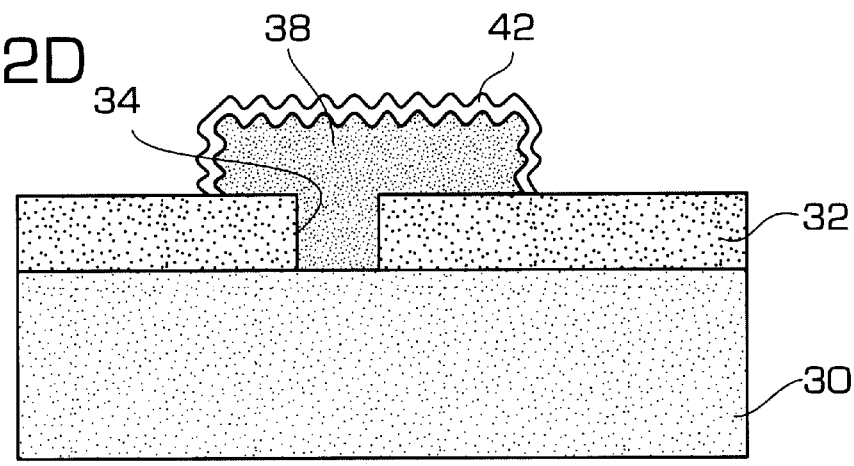
Figure 2E:
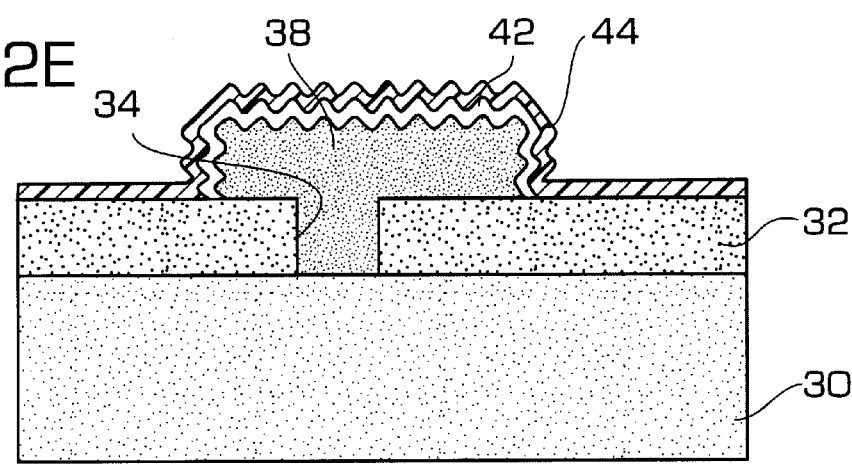

The top surface of the resultant structure of FIG. 2D is covered with a $Ta_2O_5$ film 44 of about 5 to 20 nm thick using a low-pressure chemical vapor deposition (LPCVD) process as shown in FIG. 2E. More specifically, the $Ta_2O_5$ film 44 is grown using gases of tetraethoxytantalum ($Ta(OC_2H_5)_5$) and oxygen ($H_2$) at temperatures between 400° C. and 500° C. Thereafter, the substrate 30 is subjected to baking in an atmosphere of $O_2$ or $O_3$ on a needed basis in order to improve film quality.

Figure 2F:
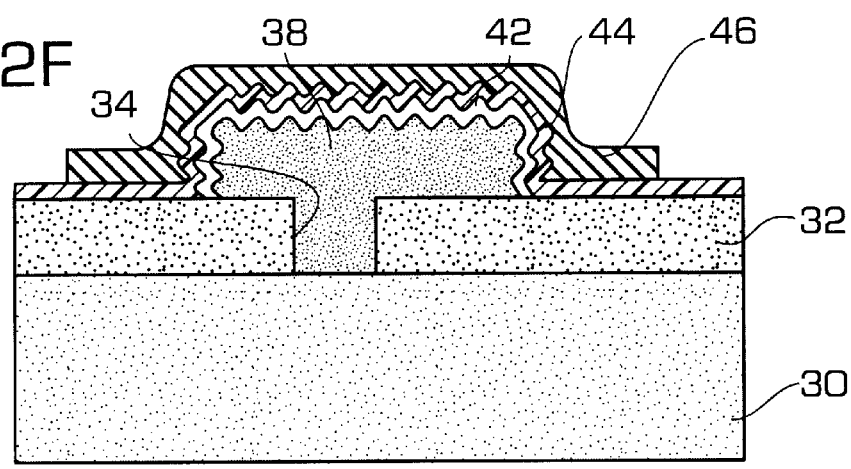

Following this, a titanium nitride film of about 100 to 200 nm thick is deposited on the structure, shown in FIG. 2E, using sputtering. Thereafter, the titanium nitride film thus deposited is patterned so as to shape an upper electrode as shown in FIG. 2F.

As mentioned above, the titanium silicide film 40 is selectively deposited only onto the film 38 and then changes to the titanium nitride by way of heating. As a result, the first embodiment of the present invention is able to omit one process step during heating and the process step of removing the titanium nitride compared with the conventional techniques.

A second embodiment of the present invention will be described with reference to FIGS. 4A–4F.

Figure 3A:
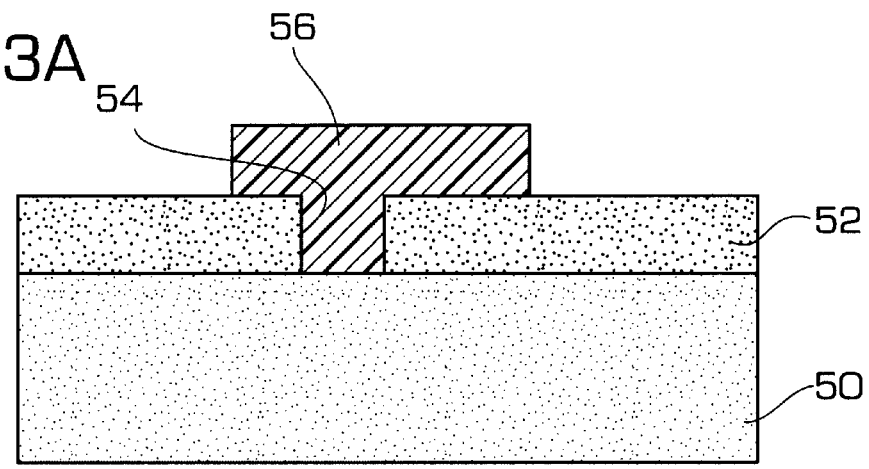
FIGS. 3A–3F each being a cross-sectional view showing a fabrication step for forming a stacked capacitor cell according to a second embodiment of the present invention.

As in the first embodiment, the sequence of fabricating a stacked capacitor cell starts with preparation of a silicon substrate 50. As shown in FIG. 3A, a silicon oxide film 52 is deposited on the top surface of the substrate 50 for electrically isolating the capacitor cell from other circuit components. A contact hole 54 is formed in the silicon oxide film 52 using known lithographic and dry etching techniques. A polysilicon film 56 of about 200 to 500 nm thick is deposited on the top surface of the silicon oxide 52 using a CVD process under the conditions: reactive gas of $SiH_4$, pressure of 13 to 26 Pa, and temperatures between 600° C. and 650° C. The polysilicon film 56 is then patterned so as to shape a lower capacitor electrode using known lithography and dry etching techniques. Thereafter, an impurity such as phosphorus is diffused into the polysilicon film 56. In this case, the phosphorus concentration in the film 56 is about $1\times10^{20}$ to $5\times10^{20}$ atoms/cm$^3$.

Figure 3B:
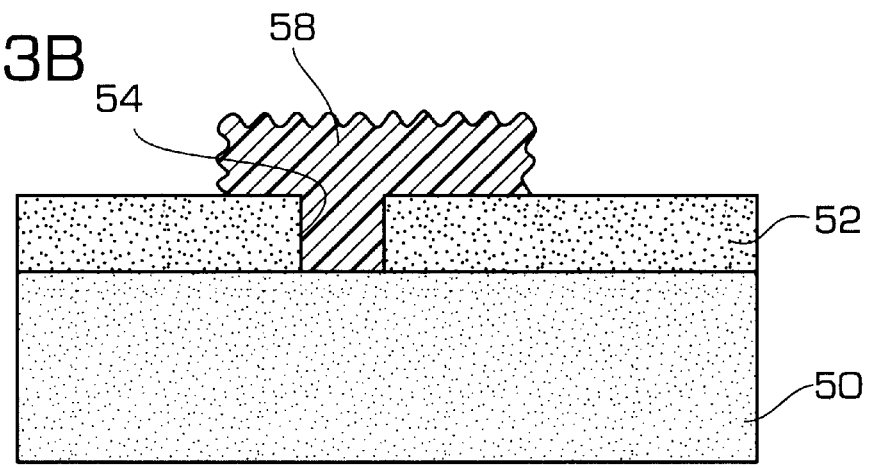

The substrate 50 is immersed in a phosphoric acid solution previously heated up to 150–180° C. in order that the surface of the polysilicon film 56 is microscopically perforated so as to have a porous surface as shown in FIG. 3B. For the sake of convenience of description, the polysilicon film having the porous surface is denoted by numeral 58. The technique for forming the porous surface is disclosed in U.S. Pat. No. 5,372,962 and thus, a further description thereof is omitted for brevity.

Figure 3C:
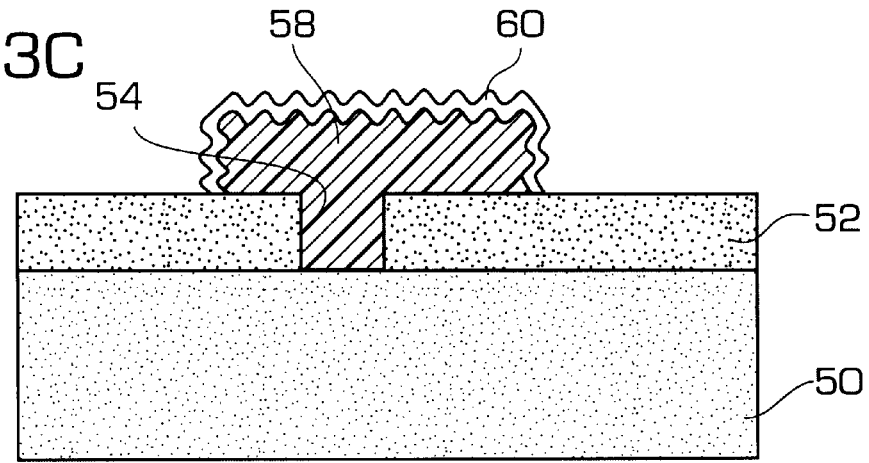

Subsequently, as shown in FIG. 3C, a titanium film 60 is selectively deposited on the polysilicon film 58 using a plasma-assisted CVD process. More specifically, the titanium film 60 is formed under the conditions: a titanium tetrachloride ($TiCl_4$) gas at a flow rate of 0.1–0.5 cc/m, a hydrogen ($H_2$) gas at a flow rate of 10–50 cc/m, an argon (Ar) gas at a flow rate of 10–50 cc/m, pressure of 0.3 to 1.0 Pa, radio frequency (RF) power of 50 to 200 W, and temperatures between 600° C. and 750° C. While the titanium film 60 is growing, a titanium silicide layer is also generated by a reaction between titanium and silicon on the surface of the film 60. The titanium film 60 is then subjected to annealing at temperatures between 700° C. and 900° C. in an atmosphere of nitrogen or ammonia. Thus, as shown in FIG. 3D, the surface of the titanium film changes to a titanium nitride film 62.

The following processes of the second embodiment are essentially the same as those of the first embodiment.

Figure 3D:
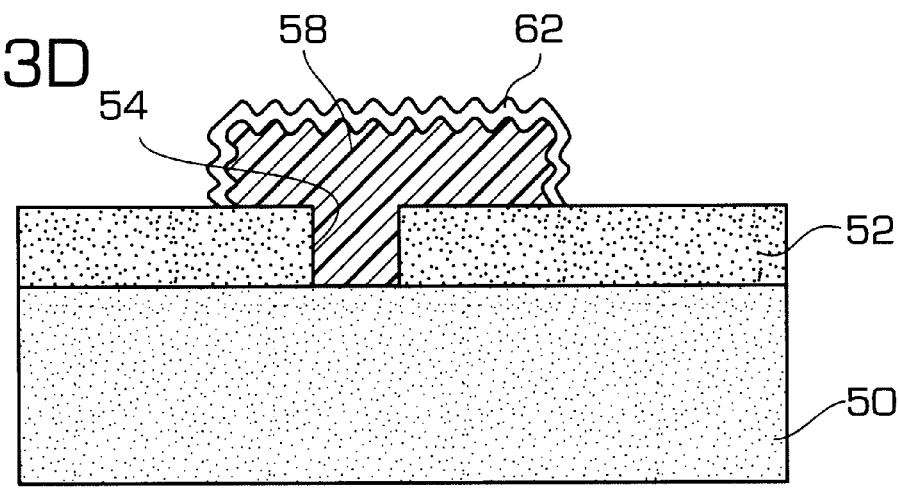
Figure 3E:
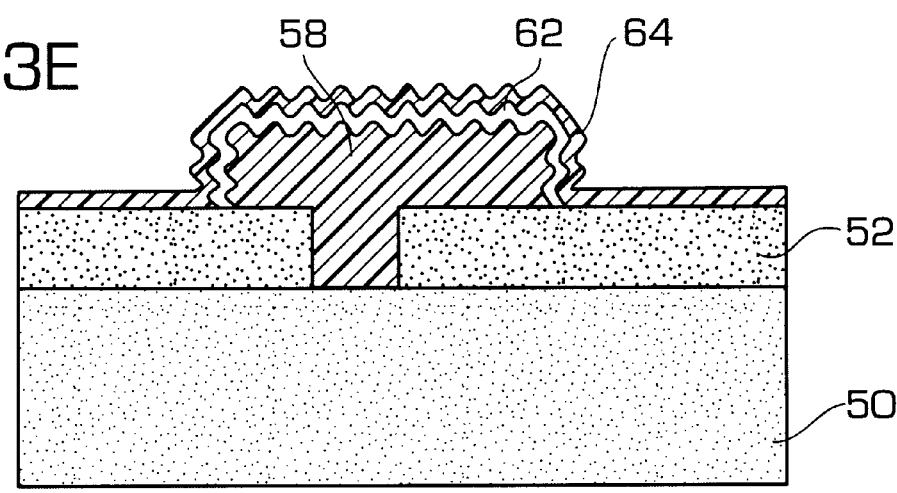
Figure 3F:
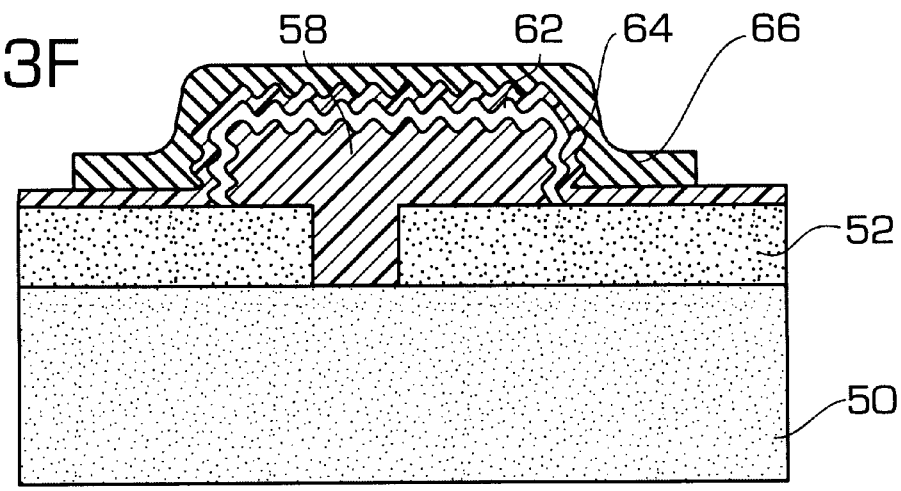

That is, the top surface of the resultant structure of FIG. 3D is covered with a $Ta_2O_5$ film 64 of about 5 to 20 nm thick using an LPCVD process as shown in FIG. 3E. More specifically, the $Ta_2O_5$ film 64 is grown using gases of tetraethoxytantalum ($Ta(OC_2H_5)_5$) and oxygen ($H_2$) at temperatures between 400° C. and 500° C. Thereafter, the substrate 50 is subjected to baking in an atmosphere of $O_2$ or $O_3$ on a needed basis in order to improve film quality. Following this, a titanium nitride film of about 100 to 200 nm thick is deposited, using a sputtering process, on the structure of FIG. 3E. Thereafter, the titanium nitride film thus deposited is patterned so as to form an upper electrode 66 as shown in FIG. 3F.

It is understood that the titanium silicide film 40 is selectively deposited on the lower electrode 38 in the first embodiment and thus, the number of process steps can be reduced compared with the conventional technique. This applies to the second embodiment as well.

Further, as mentioned above, with the first embodiment, $TiCl_4$ is used when the titanium silicide film 40 is deposited on the lower electrode 38 with a porous surface using the CVD process. Similarly, with the second embodiment, $TiCl_4$ is also used when the titanium film 60 is deposited on the lower electrode 58 using the CVD process. This means that a native oxide(s) formed on the lower electrode can be reduced during the CVD process. Therefore, according to the present invention, a relatively long time period (up to 5 days for example) is permitted until depositing the film 40 (or 60) on the lower electrode 38 (or 58) after forming the lower electrode.

On the contrary, with the conventional process, the reduction of the native oxides is not expected during the film deposition process itself and thus, they should be cleaned before depositing each of the titanium film 18 and the titanium silicide film 20. Further, the deposition of each of the films 18 and 20 should be finished in a short time after cleaning the corresponding film. Such a time duration is only a half-day (for example). Accordingly, if such a time period expires after cleaning, another cleaning becomes necessary prior to the deposition of the film 18 and 20. That leads to the increase in the number of cleaning processes.

FIG. 4 is a graph plotting a ratio of "storage area of lower electrode after cleaning" to "initial storage area of lower electrode" as a function of the number of cleaning processes. It is clear from the graph that the ratio undesirably decreases with increase in the number of cleaning processes.

Figure 5:
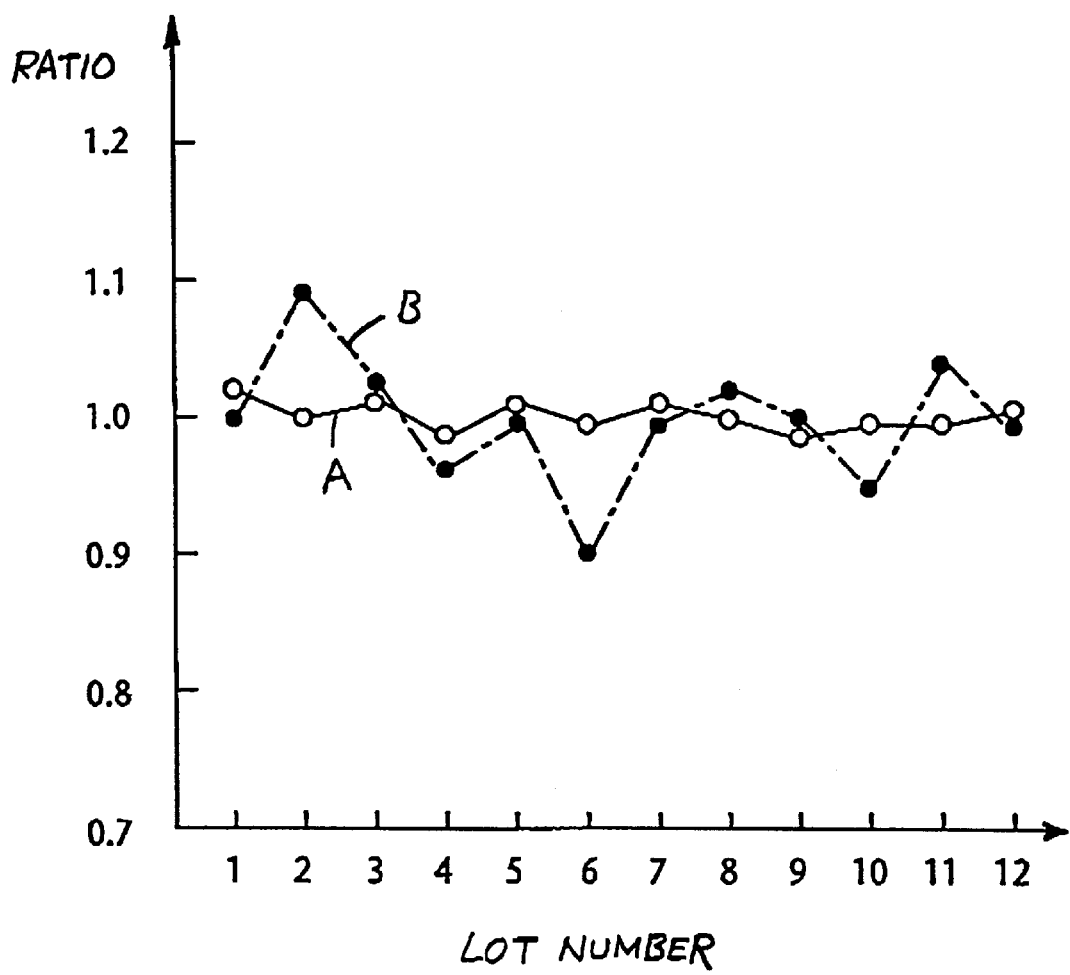
FIG. 5 is a graph showing variations of capacitance values with different lots in connection with the prior art and one embodiment of the present invention.

FIG. 5 is a graph plotting two ratios A and B each of "actual capacitance value" to "designed capacitance value" which varies with different lots. The ratios A and B respectively indicate the computer simulation results obtained based on the conventional technique and the second embodiment of the present invention. It is understood that a similar result will be obtained with the first embodiment as well. As mentioned above, with the conventional technique, the porous surface of the lower electrode tends to be smoothed with each cleaning process whereby the effective charge storage surface is reduced. In connection with the conventional technique, the number of cleaning processes may vary with different lots and therefore, the ratio B varies greatly compared with the ratio A.

In the foregoing, each of the titanium silicide film 40 and the titanium film 60 may be formed using a low-pressure CVD under the conditions: $TiCl_4$ (gas flow rate of 0.1 to 0.5 cc/m), $SiH_4$ (gas flow rate of 3 to 20 cc/m), pressure of 0.1 to 1.0 Pa, and temperatures between 650° C. and 750° C. (for example). Further, the capacitor dielectric film may be made of a material exhibiting a high permittivity or feroelectricity. Still further, the present invention is applicable to a capacitor dielectric film such as a silicon oxide film, a silicon nitride film, etc.

It will be understood that the above disclosure is representative of only one possible embodiment of the present invention and that the concept on which the invention is based is not specifically limited thereto.

What is claimed is:

1. A method of fabricating a semiconductor device, comprising the steps of:
    (a) preparing a substrate for an integrated circuit having a capacitor;
    (b) forming a lower capacitor electrode on said substrate, said lower capacitor electrode having a porous surface;
    (c) depositing a titanium nitride film on said lower capacitor electrode by depositing a titanium silicide film on said lower capacitor electrode and annealing said titanium silicide film in an atmosphere of nitrogen or ammonium;
    (d) depositing a dielectric film of a material, exhibiting high permittivity or feroelectricity, on said titanium nitride film; and
    (e) depositing an upper capacitor electrode on said dielectric film.

2. A method as claimed in claim 1, wherein said titanium silicide film is selectively deposited only on said lower capacitor electrode.

3. A method of fabricating a semiconductor device comprising the steps of
    (a) preparing a substrate for an integrated circuit having a capacitor;
    (b) forming a lower capacitor electrode on said substrate said lower capacitor electrode having a porous surface;
    (c) depositing a titanium nitride film on said lower capacitor electrode by depositing a titanium film on said lower capacitor electrode and nitrogenizing a surface of said titanium film through annealing said titanium film in an atmosphere of nitrogen or ammonium;
    (d) depositing a dielectric film of a material exhibiting high permittivity or feroelectricity, on said titanium nitride film; and
    (e) depositing an upper capacitor electrode on said dielectric film.

4. A method as claimed in claim 3, wherein said titanium film is selectively deposited only on said lower capacitor electrode.

5. A method as claimed in claim 1, further including, after step (e), annealing said dielectric film in an atmosphere of hydrogen or ozone.

6. A method as claimed in claim 1, wherein said dielectric film is made of $Ta_2O_5$.

7. A method as claimed in claim 3, further including, after step (e), annealing said dielectric film in an atmosphere of hydrogen or ozone.

8. A method as claimed in claim 3, wherein said dielectric film is made of $Ta_2O_5$.

* * * * *